(12) United States Patent
Kho et al.

(10) Patent No.: US 9,125,317 B2
(45) Date of Patent: Sep. 1, 2015

(54) DIN RAIL MOUNT BRACKET

(71) Applicant: Cisco Technology, Inc., San Jose, CA (US)

(72) Inventors: ChuanKeat Kho, San Jose, CA (US); Toan Chau, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 208 days.

(21) Appl. No.: 13/833,930

(22) Filed: Mar. 15, 2013

(65) Prior Publication Data

US 2014/0268512 A1 Sep. 18, 2014

(51) Int. Cl.
*H02B 1/052* (2006.01)
*H05K 7/14* (2006.01)

(52) U.S. Cl.
CPC .............. *H05K 7/1474* (2013.01); *H02B 1/052* (2013.01); *H02B 1/0523* (2013.01)

(58) Field of Classification Search
USPC .............. 200/50.11; 248/544, 651, 681, 27.1; 439/532
See application file for complete search history.

(56) References Cited

U.S. PATENT DOCUMENTS

| | | | | |
|---|---|---|---|---|
| 4,921,445 | A * | 5/1990 | Herbert | 439/532 |
| 5,285,354 | A * | 2/1994 | Ohsawa et al. | 361/752 |
| 5,904,592 | A * | 5/1999 | Baran et al. | 439/532 |
| 6,252,765 | B1 * | 6/2001 | Balzaretti et al. | 361/679.42 |
| 6,292,076 | B1 * | 9/2001 | DeGrazia et al. | 335/202 |
| 6,563,697 | B1 * | 5/2003 | Simbeck et al. | 361/668 |
| 7,516,927 | B2 * | 4/2009 | Portal | 248/221.11 |
| 7,674,129 | B1 * | 3/2010 | Liu | 439/532 |
| 8,226,433 | B1 * | 7/2012 | Correll et al. | 439/532 |
| 2002/0158729 | A1 * | 10/2002 | Allada et al. | 335/132 |
| 2008/0108248 | A1 * | 5/2008 | Lim et al. | 439/532 |
| 2008/0166896 | A1 * | 7/2008 | Choi et al. | 439/43 |
| 2009/0129101 | A1 * | 5/2009 | Bowden et al. | 362/371 |
| 2009/0286422 | A1 * | 11/2009 | Henkel et al. | 439/532 |
| 2010/0255713 | A1 * | 10/2010 | Peng | 439/532 |
| 2011/0269339 | A1 * | 11/2011 | Baran | 439/532 |
| 2013/0260605 | A1 * | 10/2013 | Kawabata | 439/532 |
| 2013/0322044 | A1 * | 12/2013 | Kusumi et al. | 361/807 |
| 2014/0199864 | A1 * | 7/2014 | Devanand et al. | 439/116 |

* cited by examiner

*Primary Examiner* — Bradley Duckworth
(74) *Attorney, Agent, or Firm* — Merchant & Gould P.C.

(57) ABSTRACT

A bracket may be provided. The bracket may comprise a main plate comprising a bend. In addition, the bracket may comprise a slider plate configured to movably slide against the main plate. The slider plate may further comprise an offset that may be substantially parallel with the bend. The bracket may further comprise a charging device configured create a force in a direction from the offset to the bend.

28 Claims, 8 Drawing Sheets

DIN RAIL MOUNT BRACKET

BACKGROUND

A DIN rail is a standard metal rail that is widely used for mounting circuit breakers and industrial control equipment inside equipment racks. A DIN rail may be made from cold rolled carbon steel sheet with a zinc-plated and chromated bright surface finish. The term "DIN" comes from the original specifications published by Deutsches Institut für Normung (DIN) in Germany that have been adopted as European (EN) and international (ISO) standards.

BRIEF DESCRIPTION OF THE DRAWINGS

The accompanying drawings, which are incorporated in and constitute a part of this disclosure, illustrate various embodiments of the present disclosure. In the drawings.

DETAILED DESCRIPTION

Overview

Figure 1A:
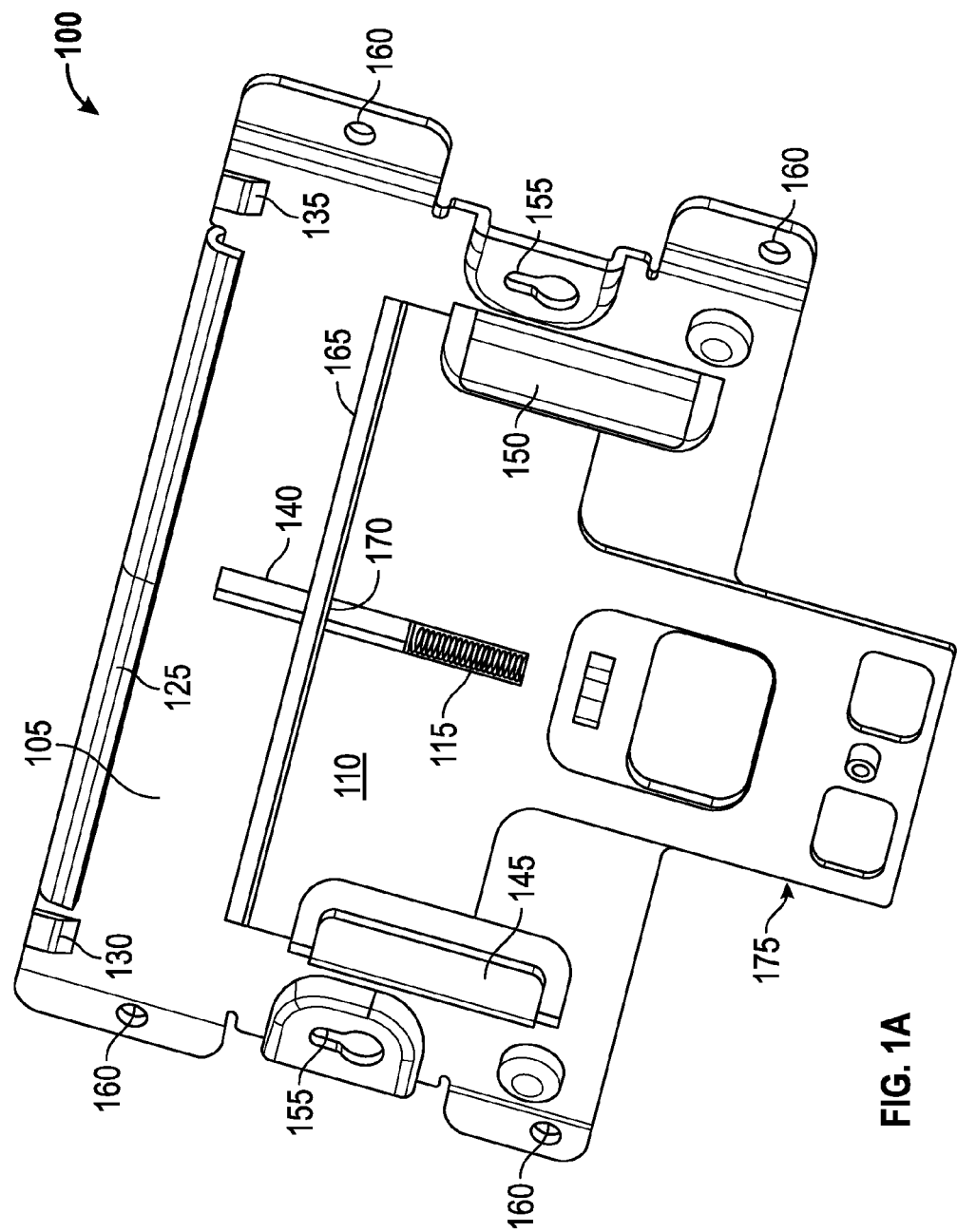
FIG. 1A shows a front view of a bracket.

A bracket may be provided. The bracket may comprise a main plate comprising a bend. In addition, the bracket may comprise a slider plate configured to movably slide against the main plate. The slider plate may further comprise an offset that may be substantially parallel with the bend. The bracket may further comprise a charging device configured create a force in a direction from the offset to the bend.

Both the foregoing overview and the following example embodiment are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiment.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Figure 1B:
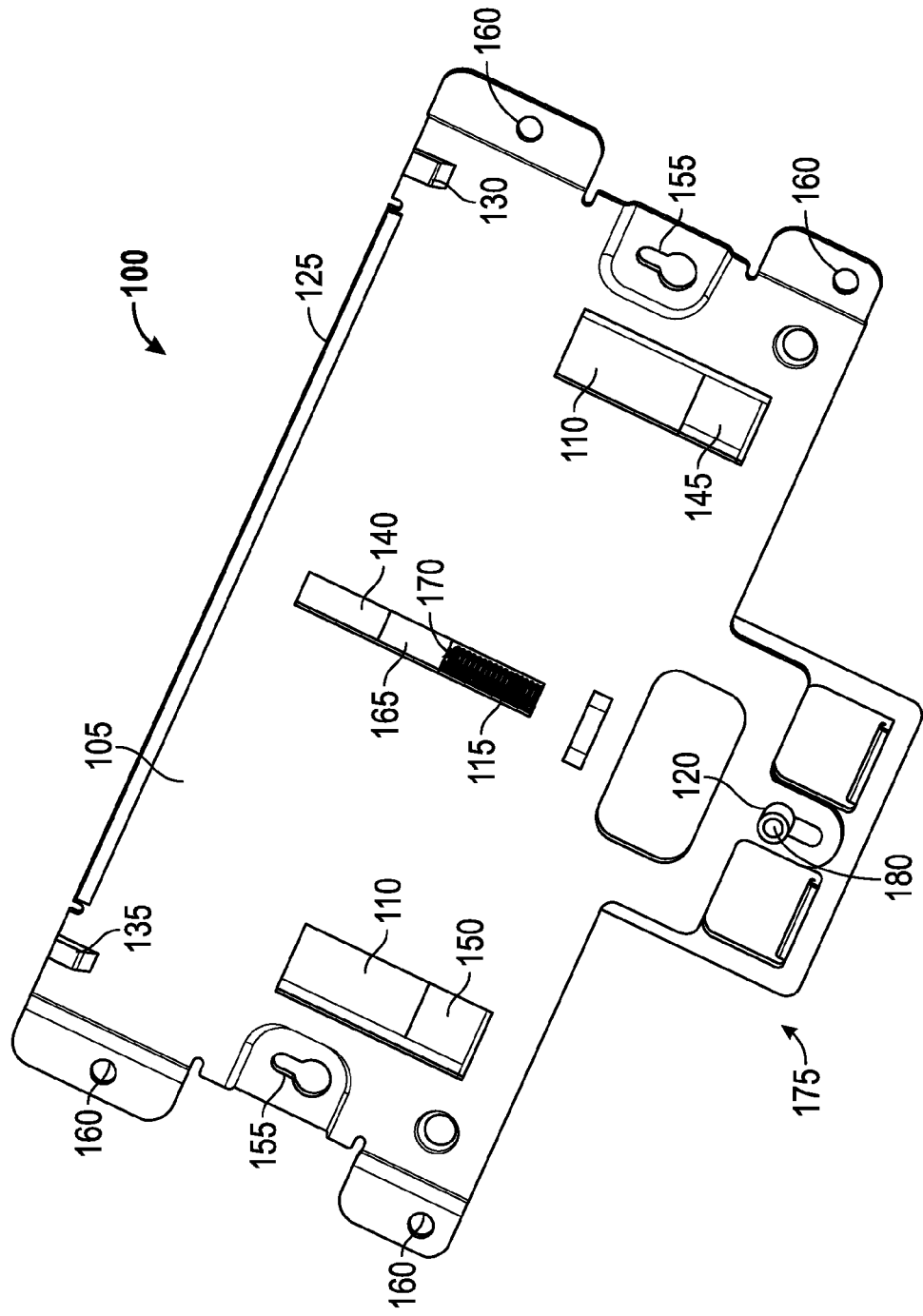
FIG. 1B shows a back view of a bracket.

FIG. 1A shows a front view of a bracket 100 and FIG. 1B shows a back view of bracket 100. As shown in FIG. 1A and FIG. 1B, bracket 100 may comprise a main plate 105, a slider plate 110, a charging device 115, and a slider plate fastener 120. Main plate 105 may comprise a bend 125 (e.g. a v-bend), a first emboss 130, a second emboss 135, a slot 140, a first retainer 145, a second retainer 150, a plurality of cutouts 155, and a plurality of perforations 160. Slider Plate 110 may comprise an offset 165, a key 170, a handle 175, and a stud 180. Charging device 115 may comprise, but is not limited to a spring. Slider plate fastener 120 may comprise, but is not limited to, a nut.

Slider plate 110 may be configured to movably slide against main plate 105. Slider plate 110's offset 165 may be substantially parallel with bend 125 of main plate 105. Charging device may be configured to create a force in a direction from offset 165 to bend 125 and may be disposed between main plate 105 and slider plate 110. Key 170 may movably ride in slot 140 as slider plate 110 movably slides against main plate 105. Charging device 115 may be disposed in slot 140 and may be connected to key 170.

Main plate 105 may further comprise at least one retainer configured to retain slider plate 110. For example, first retainer 145 and second retainer 150 on main plate 105 may retain slider plate 110 as slider plate 110 movably slides against main plate 105. Slider plate 110 may further comprise handle 175. An operator may pull on handle 175 to charge charging device 115 as slider plate 110 movably slides against main plate 105 in response to handle 175 being pulled. When handle 175 is released, charge charging device 115 may discharge to create a force in a direction from offset 165 to the bend 125 as slider plate 110 movably slides against main plate 105.

Plurality of cutouts 155 may accommodate fasteners configured to attach bracket 100 to a wall or other stationary element, for example. Plurality of perforations 160 may accommodate fasteners configured to attach a device to bracket 100. Moreover, main plate 105 may comprise at least one emboss (e.g. first emboss 130 and a second emboss 135.) As will be described in greater detail below, the at least one emboss may be configured to inhibit bracket 100 from sliding against, for example, a DIN rail when bracket 100 is installed on the DIN rail.

Bracket 100 may further comprise slider plate fastener 120 configured, when engaged, to inhibit slider plate 110 from movably sliding against main plate 105. For example, once bracket 100 is installed, slider plate fastener 120 may be engaged (e.g. a nut tightened on stud 180) to inhibit slider plate 110 from movably sliding against main plate 105 when handle 175 is pulled.

Figure 2:
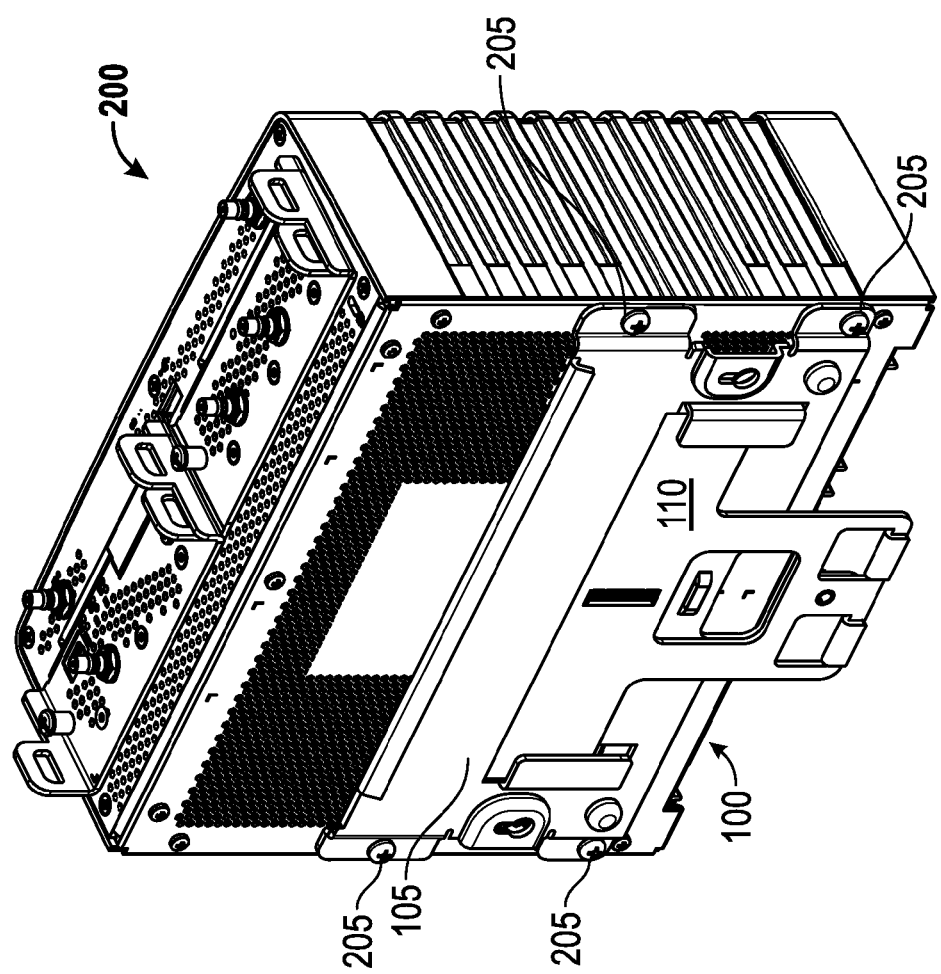
FIG. 2 shows a bracket with a networking device mounted to it.

FIG. 2 shows bracket 100 with a networking device 200 mounted to it. As shown in FIG. 2, networking device 200 may comprise, but is not limited to a router, a switch, or any type device. Networking device 200 may be mounted to bracket 100 via plurality of network device fasteners 205 respectively disposed through plurality of perforations. Plurality of network device fasteners 205 may comprise, but are not limited to, screws.

Figure 3:
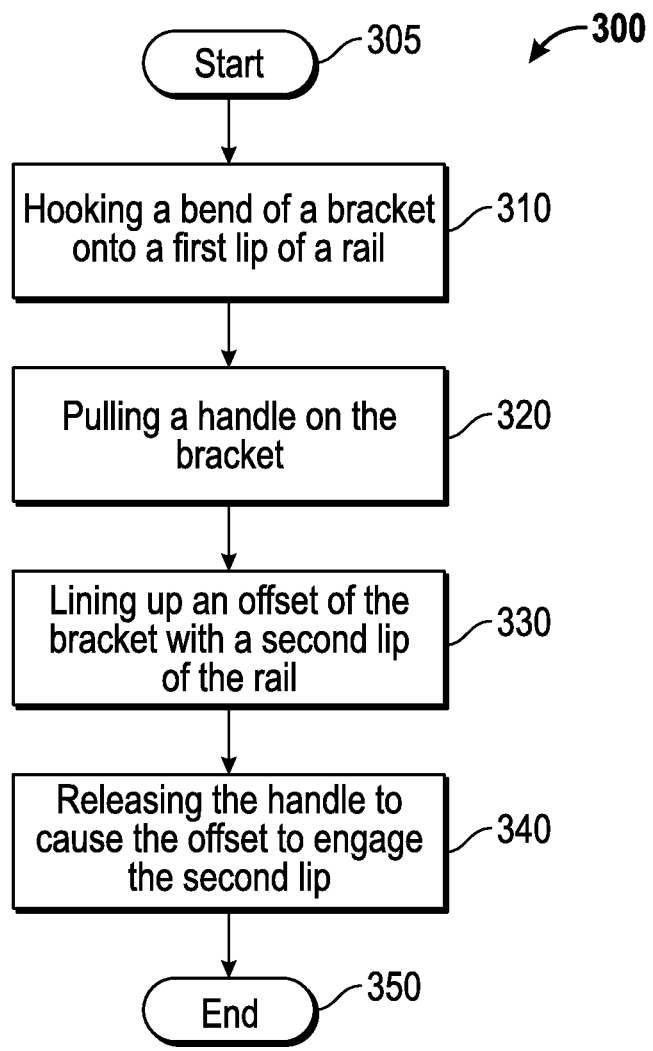
FIG. 3 is a flow chart of a method for using a DIN rail mount bracket.

FIG. 3 is a flow chart setting forth the general stages involved in a method 300 consistent with embodiments of the disclosure for using a DIN rail mount bracket (e.g. bracket 100.) Ways to implement the stages of method 300 will be described in greater detail below.

Figure 4:
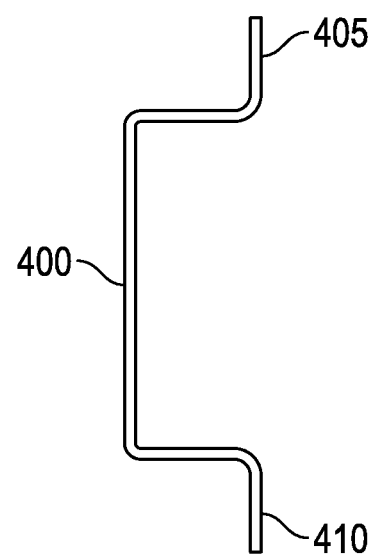
FIG. 4 shows a rail.
Figure 5A:
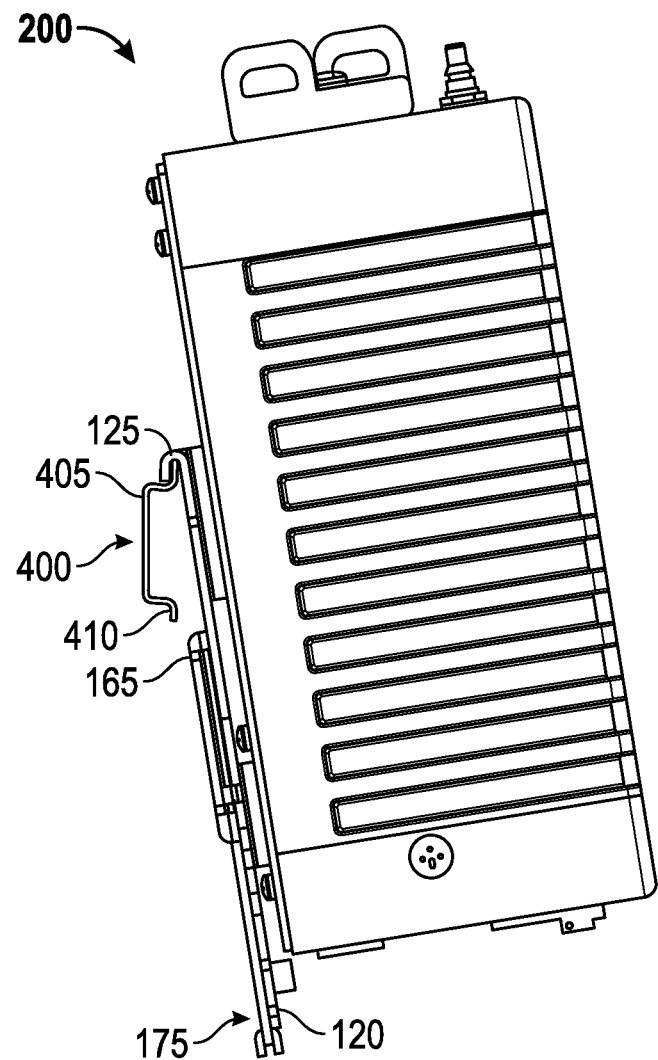
FIG. 5A shows a bracket with a networking device mounted to it being installed on a rail.
Figure 6:
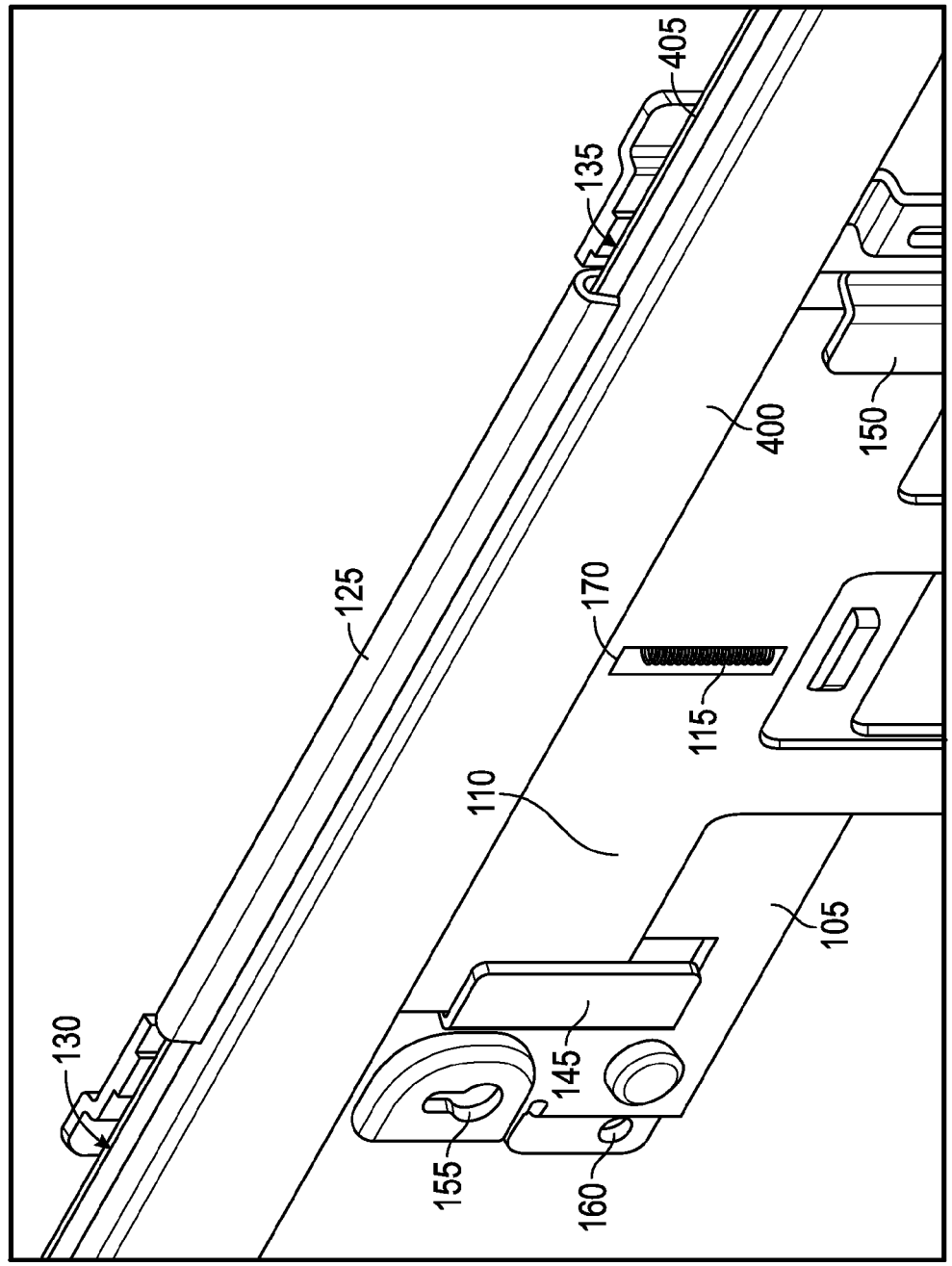
FIG. 6 shows a bracket with a networking device mounted to it installed on a rail.

Method 300 may begin at starting block 305 and proceed to stage 310 where bend 125 of bracket 100 may be hooked onto a first lip 405 of a rail 400 as illustrated in FIG. 4. For example, as shown in FIG. 5A, rail 400 may be mounted to a wall or to a rack. With networking device 200 attached to bracket 100, bend 125 of bracket 100 may be hooked onto first lip 405. As illustrated in FIG. 5A, networking device 200 may be held at a slight angle (e.g. 30 degrees) during this operation. As illustrated in FIG. 6, bend 125 may create an even pressure along first lip 405 after bend 125 is hooked onto a first lip 405.

From stage 310, where bend 125 of bracket 100 is hooked onto first lip 405 of rail 400, method 300 may advance to stage 320 where handle 175 on bracket 100 may be pulled. For example, with networking device 200 still held at a slight angle, handle 175 may be pulled to cause charging device 115 to be charged and to cause offset 165 to clear or otherwise not interfere with a second lip 410 on rail 400.

Figure 5B:
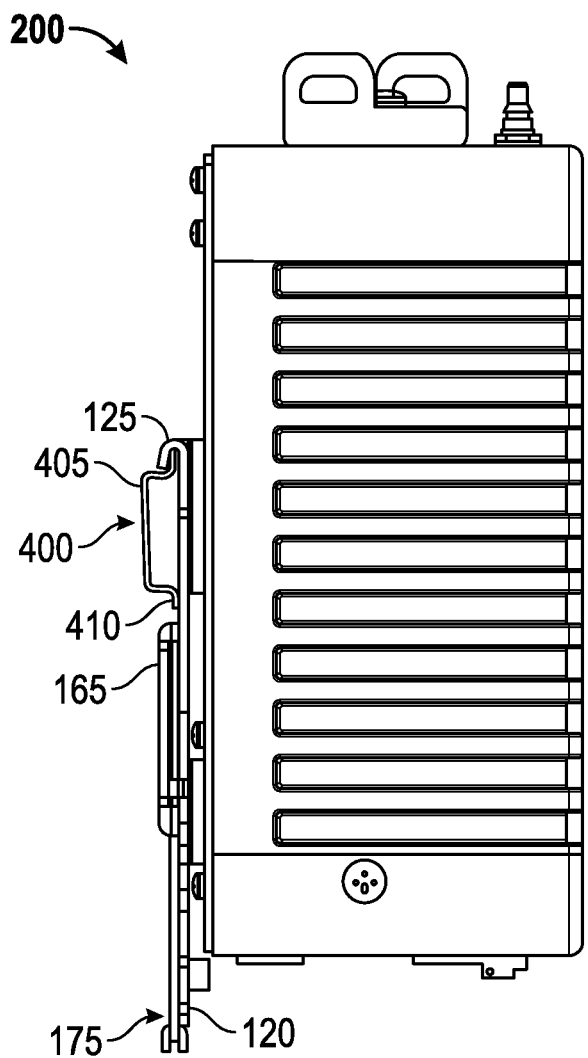
FIG. 5B shows a bracket with a networking device mounted to it being installed on a rail.

Once handle 175 on bracket 100 has been pulled in stage 320, method 300 may continue to stage 330 where offset 165 of bracket 100 may be lined up with second lip 410 of rail 400. For example, because offset 165 may be clear of or may otherwise not interfere with a second lip 410, the slight angle that networking device 200 is being held at may be relaxed to the position shown in FIG. 5B.

After offset 165 of bracket 100 is lined up with second lip 410 of rail 400 in stage 330, method 300 may proceed to stage 340 where handle 175 may be released to cause offset 165 to engage second lip 410. For example, with the slight angle being relaxed (FIG. 5B), handle 175 may be released to discharge charge charging device 115 to create a force in a direction from offset 165 to the bend 125 as slider plate 110 movably slides against main plate 105. In this way, offset 165 may snuggly fit in behind second lip 410 in a manner similar to which bend 125 may snuggly fit in behind first lip 405. Because charging device 115 may not have completely discharged, bend 105 and offset 110 may pinch and hold rail 400.

After handle 175 is released, slider plate fastener 120 may be engaged (e.g. a nut tightened on stud 180). When slider plate fastener 120 is engaged, a strong frictional force may be created between main plate 105 and slider plate 110 thus inhibiting slider plate 110 from movably sliding against main plate 105. For example, once bracket 100 is installed (e.g. position shown in FIG. 5A), slider plate fastener 120 may be engaged to inhibit slider plate 110 from movably sliding against main plate 105 when handle 175 is pulled.

Furthermore, once bracket 100 is installed (e.g. position shown in FIG. 5A), the at least one emboss (e.g. first emboss 130 and second emboss 135) may be configured to inhibit bracket 100 from sliding against, for example, rail 400 when bracket 100 is installed on rail 400. With offset 165 snuggly fit in behind second lip 410 and bend 125 snuggly fit in behind first lip 405, first emboss 130 and second emboss 135 may be pressed up snuggly against the front of first lip 405 creating a strong frictional force between first emboss 130 and the front of first lip 405 and between second emboss 135 and the front of first lip 405. These frictional forces may inhibit bracket 100 from sliding along rail 400 when bracket 100 is installed on rail 400. Once handle 175 has been released in stage 340, method 300 may then end at stage 350.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. An apparatus comprising:
   a main plate comprising a bend disposed along an upper edge of the main plate;
   a slider plate configured to movably slide against the main plate, the slider plate comprising an offset disposed along an entire upper edge of the slider plate, the offset being substantially parallel with the bend, wherein the bend and the offset are substantially the same length; and
   a charging device configured to create a force in a direction from the offset to the bend.

2. The apparatus of claim 1, wherein the charging device is disposed between the main plate and the slider plate.

3. The apparatus of claim 1, wherein the charging device comprises a spring.

4. The apparatus of claim 1, wherein the main plate comprises a slot comprising an opening set into the main plate.

5. The apparatus of claim 4, wherein the slider plate comprises a key configured to movably ride in the slot as the slider plate movably slides against the main plate.

6. The apparatus of claim 5, wherein the charging device is disposed in the slot.

7. The apparatus of claim 5, wherein the charging device is connected to the key.

8. The apparatus of claim 1, wherein the slider plate comprises a key.

9. The apparatus of claim 8, wherein the main plate comprises a slot, the key configured to movably ride in the slot as the slider plate movably slides against the main plate.

10. The apparatus of claim 9, wherein the charging device is disposed in the slot.

11. The apparatus of claim 9, wherein the charging device is connected to the key.

12. The apparatus of claim 1, wherein the main plate further comprises at least one emboss.

13. The apparatus of claim 1, wherein the main plate further comprises at least one retainer configured to retain the slider plate.

14. The apparatus of claim 1, wherein the main plate further comprises at least one cutout.

15. The apparatus of claim 1, wherein the main plate further comprises at least one perforation configured to accommodate at least one device fastener.

16. The apparatus of claim 1, wherein the slider plate further comprises a handle.

17. The apparatus of claim 1, further comprising a slider plate fastener configured, when engaged, to inhibit the slider plate from movably sliding against the main plate, the slider plate fastener comprising a stud protruding from the slider plate and a nut threaded to the stud.

18. An apparatus comprising:
   a main plate comprising a bend disposed along an upper edge of the main plate, the bend being configured to engage a first lip of a rail;
   a slider plate configured to movably slide against the main plate, the slider plate comprising an offset disposed along an entire upper edge of the slider plate, the offset being substantially parallel with the bend, the offset configured to engage a second lip of the rail the bend and the offset being substantially the same length; and a spring configured create a force in a direction from the offset to the bend configured to cause the offset to maintain contact with the second lip.

19. The apparatus of claim 18, wherein the main plate comprises a slot comprising an opening set into the main plate and the slider plate comprises a key configured to movably ride in the slot as the slider plate movably slides against the main plate.

20. The apparatus of claim 18, wherein the spring is disposed in the slot and connected to the key.

21. The apparatus of claim 18, wherein the main plate further comprises at least one emboss configured to inhibit the apparatus from sliding along the rail.

22. The apparatus of claim 18, wherein the main plate further comprises at least one retainer configured to retain the slider plate.

23. The apparatus of claim 18, wherein the main plate is attached to a network device.

24. A method comprising:
hooking a bend disposed along an upper edge of a main plate of a bracket onto a first lip of a rail;
pulling a handle on the bracket;
lining up an offset of the bracket with a second lip of the rail, the offset disposed along an entire upper edge of a slider plate, the offset being substantially parallel with the bend, the offset being substantially the same length as the bend; and
releasing the handle to cause the offset to engage the second lip.

25. The method of claim 24, further comprising engaging a slider plate fastener configured to inhibit the slider plate from movably sliding against the main plate.

26. The method of claim 24, wherein hooking the bend of the bracket onto the first lip of the rail comprises hooking the bend of the bracket onto the first lip of the rail wherein the bracket is attached to a network device.

27. The method of claim 24, wherein pulling the handle on the bracket comprises pulling the handle in a downward direction.

28. The method of claim 24, wherein lining up the offset of the bracket with the second lip of the rail comprises lining up the offset of the bracket with the second lip of the rail comprising a DIN rail.

* * * * *